United States Patent
Harris et al.

(10) Patent No.: US 10,971,660 B2
(45) Date of Patent: Apr. 6, 2021

(54) WHITE LED LIGHT SOURCE AND METHOD OF MAKING SAME

(71) Applicant: Eyesafe, LLC, Eden Prairie, MN (US)

(72) Inventors: Derek Harris, Saint Paul, MN (US); Arkady Garbar, Lakeville, MN (US)

(73) Assignee: Eyesafe Inc., Eden Prairie, MN (US)

( * ) Notice: Subject to any disclaimer, the term of this patent is extended or adjusted under 35 U.S.C. 154(b) by 6 days.

(21) Appl. No.: 16/696,516

(22) Filed: Nov. 26, 2019

(65) Prior Publication Data
US 2021/0043807 A1    Feb. 11, 2021

Related U.S. Application Data

(60) Provisional application No. 62/884,975, filed on Aug. 9, 2019.

(51) Int. Cl.
| | |
|---|---|
| *H01L 33/52* | (2010.01) |
| *H01L 33/50* | (2010.01) |
| *H01L 33/58* | (2010.01) |
| *H01L 33/56* | (2010.01) |
| *H01L 51/52* | (2006.01) |

(52) U.S. Cl.
CPC .......... *H01L 33/504* (2013.01); *H01L 33/502* (2013.01); *H01L 33/507* (2013.01); *H01L 33/52* (2013.01); *H01L 33/56* (2013.01); *H01L 33/58* (2013.01); *H01L 51/5262* (2013.01); *H01L 51/5284* (2013.01)

(58) Field of Classification Search
CPC ... H01L 33/501; H01L 33/502; H01L 33/504; H01L 33/507; H01L 33/52; H01L 33/56; H01L 33/58; H01L 51/5262; H01L 51/5281; H01L 51/5284
See application file for complete search history.

(56) References Cited

U.S. PATENT DOCUMENTS

| | | |
|---|---|---|
| 2,403,685 A | 7/1946 | Sachtleben |
| 2,493,200 A | 1/1950 | Land |
| 3,382,183 A | 5/1968 | Donoian |
| (Continued) | | |

FOREIGN PATENT DOCUMENTS

| | | |
|---|---|---|
| CN | 101216611 A | 7/2008 |
| CN | 101899222 A | 12/2010 |
| (Continued) | | |

OTHER PUBLICATIONS

Abramowitz, Mortimer and Davidson, Michael W. "Kodak Color Compensating Filters Yellow." Olympus Microscopy Resource Center olympus-lifescience.com. Retrieved May 16, 2019.
(Continued)

*Primary Examiner* — Stephen W Smoot
(74) *Attorney, Agent, or Firm* — Grumbles Law PLLC; Brittany R. Nanzig; Stephen F. Wolf

(57) ABSTRACT

A light source that includes an LED light source, and one or more encapsulants containing a light-absorbing component that absorbs light in the wavelength range of about 415 nm to about 435 nm and can include at least one phosphor that can provide an LED light source that emits white light having a reduced amount of blue light or even toxic blue light with minimal effect on color characteristics such as correlated color temperature (CCT), color gamut, and luminance.

12 Claims, 4 Drawing Sheets

(56) References Cited

U.S. PATENT DOCUMENTS

| | | | | |
|---|---|---|---|---|
| 3,482,915 | A | 12/1969 | Corley | |
| 3,687,863 | A | 8/1972 | Wacher | |
| 4,618,216 | A | 10/1986 | Suzawa | |
| 4,842,781 | A | 6/1989 | Nishizawa | |
| 4,878,748 | A | 11/1989 | Johansen | |
| 4,966,441 | A | 10/1990 | Conner | |
| 4,989,953 | A | 2/1991 | Kirschner | |
| 5,083,252 | A | 1/1992 | McGuire | |
| 5,177,509 | A | 1/1993 | Johansen | |
| 5,483,464 | A | 1/1996 | Song | |
| 5,555,492 | A | 9/1996 | Feger | |
| 5,745,391 | A | 4/1998 | Topor | |
| 5,952,096 | A | 9/1999 | Yamashita | |
| 6,019,476 | A | 2/2000 | Kirschner | |
| 6,229,252 | B1 | 5/2001 | Teng et al. | |
| 6,663,978 | B1 | 12/2003 | Olsen | |
| 6,778,238 | B2 | 8/2004 | Moon | |
| 6,824,712 | B1 | 11/2004 | Yang | |
| 6,826,001 | B2 | 11/2004 | Funakura | |
| 6,846,579 | B2 | 1/2005 | Anderson | |
| 6,955,430 | B2 | 10/2005 | Pratt | |
| 6,984,038 | B2 | 1/2006 | Ishak | |
| 6,991,849 | B2 | 1/2006 | Oya | |
| 7,014,336 | B1 | 3/2006 | Ducharme | |
| 7,019,331 | B2 | 3/2006 | Winters | |
| 7,019,799 | B2 | 3/2006 | Utsumi | |
| 7,019,903 | B2 | 3/2006 | Berger | |
| 7,029,118 | B2 | 4/2006 | Ishak | |
| 7,045,944 | B2 | 5/2006 | Ushifusa | |
| 7,066,596 | B2 | 6/2006 | Ishak | |
| 7,071,602 | B2 | 7/2006 | Terui | |
| 7,126,589 | B2 | 10/2006 | Sung | |
| 7,158,300 | B2 | 1/2007 | Shimoda | |
| 7,193,779 | B2 | 3/2007 | Kim | |
| 7,218,044 | B2 | 5/2007 | Kim | |
| 7,258,923 | B2 | 8/2007 | Bogerd | |
| 7,491,440 | B2 | 2/2009 | Fukatani | |
| 7,520,608 | B2 | 4/2009 | Ishak | |
| 7,524,060 | B2 | 4/2009 | Sanchez Ramos | |
| 7,556,376 | B2 | 7/2009 | Ishak | |
| 7,572,028 | B2 | 8/2009 | Mueller | |
| 7,579,769 | B2 | 8/2009 | Wu | |
| 7,695,180 | B2 | 4/2010 | Schardt | |
| 7,703,917 | B2 | 4/2010 | Sanchez Ramos | |
| 7,731,791 | B2 | 6/2010 | Deno | |
| 7,755,276 | B2 | 7/2010 | Wang | |
| 7,785,501 | B2 | 8/2010 | Segawa | |
| 7,825,578 | B2 | 11/2010 | Takashima | |
| 7,832,903 | B2 | 11/2010 | Ramos | |
| 7,914,177 | B2 | 3/2011 | Ramos | |
| 8,034,206 | B2 | 10/2011 | Kim | |
| 8,044,942 | B1 | 10/2011 | Leonhard | |
| 8,063,999 | B2 | 11/2011 | Jabri | |
| 8,075,133 | B2 | 12/2011 | Sanchez Ramos | |
| 8,075,145 | B2 | 12/2011 | Engblom | |
| 8,113,651 | B2 | 2/2012 | Blum | |
| 8,164,844 | B2 | 4/2012 | Toda | |
| 8,303,859 | B2 | 11/2012 | Koo | |
| 8,323,357 | B2 | 12/2012 | Feldhues | |
| 8,360,574 | B2 | 1/2013 | Ishak | |
| 8,403,478 | B2 | 3/2013 | Ishak | |
| 8,487,331 | B2 * | 7/2013 | Jang | C09K 11/883 257/98 |
| 8,498,042 | B2 | 7/2013 | Danner | |
| 8,500,274 | B2 | 8/2013 | Ishak | |
| 8,506,114 | B2 | 8/2013 | Van De Ven | |
| 8,507,840 | B2 | 8/2013 | Yu | |
| 8,518,498 | B2 | 8/2013 | Song | |
| 8,547,504 | B2 | 10/2013 | Guo | |
| 8,570,648 | B2 | 10/2013 | Sanchez Ramos | |
| 8,599,542 | B1 | 12/2013 | Healey | |
| 8,657,455 | B2 * | 2/2014 | Yagi | F21V 3/10 362/84 |
| 8,659,724 | B2 | 2/2014 | Hagiwara | |
| 8,680,406 | B2 | 3/2014 | Chua | |
| 8,716,729 | B2 | 5/2014 | Wiesmann | |
| 8,767,282 | B2 | 7/2014 | Hashimura | |
| 8,817,207 | B2 | 8/2014 | Rho | |
| 8,836,209 | B2 | 9/2014 | Baek | |
| 8,882,267 | B2 | 11/2014 | Ishak | |
| 8,928,220 | B2 * | 1/2015 | Ko | H01L 33/52 313/503 |
| 8,957,835 | B2 | 2/2015 | Hoellwarth | |
| 8,982,197 | B2 | 3/2015 | Kim | |
| 9,051,232 | B2 | 6/2015 | Kosuge | |
| 9,063,349 | B2 | 6/2015 | Ishak | |
| 9,122,089 | B2 | 9/2015 | Lee | |
| 9,287,471 | B2 | 3/2016 | de Brouwer | |
| 9,377,569 | B2 | 6/2016 | Ishak | |
| 9,545,304 | B2 | 1/2017 | Ishak | |
| 9,575,335 | B1 | 2/2017 | McCabe | |
| 9,798,163 | B2 | 10/2017 | Ishak | |
| 9,814,658 | B2 | 11/2017 | Ishak | |
| 9,927,635 | B2 | 3/2018 | Ishak | |
| 2002/0005509 | A1 | 1/2002 | Teng | |
| 2002/0018890 | A1 | 2/2002 | Sugimachi | |
| 2002/0158574 | A1 | 10/2002 | Wolk | |
| 2003/0214695 | A1 | 11/2003 | Abramson | |
| 2004/0070726 | A1 | 4/2004 | Ishak | |
| 2004/0114242 | A1 | 6/2004 | Sharp | |
| 2004/0166342 | A1 | 8/2004 | Wursche | |
| 2004/0181006 | A1 | 9/2004 | Warren, Jr. | |
| 2004/0246413 | A1 | 9/2004 | Stephenson | |
| 2004/0232813 | A1 | 11/2004 | Nakano | |
| 2005/0042531 | A1 | 2/2005 | Lee | |
| 2005/0259082 | A1 | 11/2005 | Potsch | |
| 2005/0275769 | A1 | 12/2005 | Roh | |
| 2006/0012754 | A1 | 1/2006 | Larson | |
| 2007/0013649 | A1 | 1/2007 | Kim | |
| 2007/0077410 | A1 | 4/2007 | Shi | |
| 2007/0078216 | A1 | 4/2007 | Cao | |
| 2007/0195404 | A1 | 8/2007 | Iijima | |
| 2007/0216861 | A1 | 9/2007 | Ishak | |
| 2007/0275184 | A1 | 11/2007 | Lee | |
| 2008/0094566 | A1 | 4/2008 | Ishak et al. | |
| 2008/0137030 | A1 | 6/2008 | Hoffman | |
| 2008/0290787 | A1 | 11/2008 | Cok | |
| 2008/0297931 | A1 | 12/2008 | Ramos | |
| 2009/0058250 | A1 | 3/2009 | Sin | |
| 2009/0105437 | A1 | 4/2009 | Determan | |
| 2009/0128895 | A1 | 5/2009 | Seo | |
| 2009/0236622 | A1 * | 9/2009 | Nishihara | H01L 33/504 257/98 |
| 2010/0022040 | A1 * | 1/2010 | Konishi | H01L 33/52 438/29 |
| 2010/0039704 | A1 | 2/2010 | Hayashi | |
| 2010/0118511 | A1 * | 5/2010 | Wegat | H01L 33/56 362/84 |
| 2010/0134879 | A1 | 6/2010 | Yoshihara | |
| 2010/0231830 | A1 | 9/2010 | Hirakata | |
| 2011/0019269 | A1 | 1/2011 | Dirk | |
| 2011/0043486 | A1 | 2/2011 | Hagiwara | |
| 2011/0157546 | A1 | 6/2011 | Ishak | |
| 2011/0176325 | A1 | 7/2011 | Sherman | |
| 2011/0234079 | A1 | 9/2011 | Eom | |
| 2011/0289654 | A1 | 12/2011 | Williams | |
| 2011/0299168 | A1 | 12/2011 | Combs | |
| 2011/0315939 | A1 | 12/2011 | Okayasu | |
| 2012/0021152 | A1 | 1/2012 | Glaser | |
| 2012/0038861 | A1 | 2/2012 | Van Lieshout | |
| 2012/0075577 | A1 | 3/2012 | Ishak | |
| 2012/0162106 | A1 | 6/2012 | Choi | |
| 2012/0162752 | A1 | 6/2012 | Kitano | |
| 2012/0217865 | A1 * | 8/2012 | Cabalu | H01L 33/504 313/483 |
| 2013/0009059 | A1 | 1/2013 | Caruso | |
| 2013/0063493 | A1 | 3/2013 | House | |
| 2013/0239874 | A1 | 9/2013 | Smith | |
| 2013/0278134 | A1 * | 10/2013 | Ko | H01L 33/52 313/503 |
| 2013/0282115 | A1 | 10/2013 | Ishak | |
| 2014/0022779 | A1 * | 1/2014 | Su | F21V 9/38 362/231 |
| 2014/0049700 | A1 | 2/2014 | Chen | |

(56) References Cited

U.S. PATENT DOCUMENTS

| | | | |
|---|---|---|---|
| 2014/0078420 A1 | 3/2014 | Liu | |
| 2014/0093661 A1 | 4/2014 | Trajkovska | |
| 2014/0233105 A1 | 8/2014 | Schmeder | |
| 2014/0355106 A1 | 12/2014 | Laluet | |
| 2014/0363767 A1 | 12/2014 | Murakami | |
| 2015/0098058 A1 | 4/2015 | De Ayguavives | |
| 2015/0124188 A1 | 5/2015 | Kadowaki | |
| 2015/0160478 A1 | 6/2015 | Ishak | |
| 2015/0212238 A1 | 7/2015 | Chang | |
| 2015/0212352 A1 | 7/2015 | Guo et al. | |
| 2015/0238308 A1 | 8/2015 | Ishak et al. | |
| 2015/0248033 A1 | 9/2015 | Zhu | |
| 2015/0253653 A1 | 9/2015 | Fujita | |
| 2015/0277003 A1 | 10/2015 | Sanchez Ramos | |
| 2015/0329684 A1 | 11/2015 | Kamimoto | |
| 2015/0338561 A1 | 11/2015 | Moe | |
| 2015/0378217 A1 | 12/2015 | Kim | |
| 2016/0126428 A1* | 5/2016 | Hosokawa | H01L 33/502 257/98 |
| 2017/0037308 A1* | 2/2017 | Romer | C09K 11/7734 |
| 2017/0315405 A1* | 11/2017 | Masuda | C09B 11/04 |
| 2017/0363884 A1 | 12/2017 | Hallock | |
| 2018/0052362 A1 | 2/2018 | Kang | |
| 2018/0064616 A1 | 3/2018 | Ishak | |
| 2018/0107050 A1 | 4/2018 | Barrett | |
| 2018/0113327 A1 | 4/2018 | Ishak | |
| 2019/0121176 A1 | 4/2019 | Lee | |
| 2019/0196071 A1 | 6/2019 | Barrett et al. | |
| 2019/0219751 A1 | 7/2019 | Barrett et al. | |
| 2019/0312185 A1* | 10/2019 | Zhang | H01L 33/56 |
| 2020/0166798 A1 | 5/2020 | Garbar et al. | |
| 2020/0174168 A1 | 6/2020 | Barrett | |
| 2020/0303598 A1* | 9/2020 | Kim | H01L 33/504 |

FOREIGN PATENT DOCUMENTS

| | | |
|---|---|---|
| CN | 201666985 U | 12/2010 |
| CN | 102879920 A | 1/2013 |
| CN | 202847016 U | 4/2013 |
| CN | 103448312 B | 12/2013 |
| CN | 203410122 U | 1/2014 |
| CN | 103941320 A | 7/2014 |
| CN | 204213761 U | 3/2015 |
| CN | 104614786 A | 5/2015 |
| CN | 104950515 A | 9/2015 |
| CN | 105788474 B | 2/2019 |
| CN | 106324908 B | 2/2019 |
| CN | 209782327 U | 12/2019 |
| DE | 202014000982 U1 | 3/2014 |
| EP | 0509727 A2 | 10/1992 |
| EP | 0855602 A1 | 7/1998 |
| EP | 0965034 B1 | 5/2007 |
| EP | 2085798 A1 | 8/2009 |
| EP | 2095177 A1 | 9/2009 |
| EP | 2096471 A1 | 9/2009 |
| EP | 2128889 A1 | 12/2009 |
| EP | 2260348 A2 | 12/2010 |
| EP | 1794240 B1 | 1/2013 |
| EP | 2874001 A1 | 5/2015 |
| EP | 3026485 A2 | 6/2016 |
| FR | 2909779 A1 | 6/2008 |
| JP | 2001315240 A | 11/2001 |
| JP | 2003149605 A | 5/2003 |
| JP | 2006031030 A | 2/2006 |
| JP | 2010511205 A | 4/2010 |
| JP | 2010261986 A | 11/2010 |
| JP | 2013067811 A | 4/2013 |
| JP | 2013222212 A | 10/2013 |
| JP | 2013238634 A | 11/2013 |
| JP | 2014000819 A | 1/2014 |
| JP | 2014225030 A | 12/2014 |
| JP | 2016128931 A | 7/2016 |
| KR | 10-2006-0048986 A | 5/2006 |
| KR | 101815619 B1 | 1/2018 |
| WO | 1988002871 A1 | 4/1988 |
| WO | 2002101695 A1 | 12/2002 |
| WO | 2004090589 A1 | 10/2004 |
| WO | 2005034066 A1 | 4/2005 |
| WO | 2005106542 A1 | 11/2005 |
| WO | 2007075520 A2 | 7/2007 |
| WO | 2007109202 A2 | 9/2007 |
| WO | 2007146933 A2 | 12/2007 |
| WO | 2008024414 A2 | 2/2008 |
| WO | 2008067109 A1 | 6/2008 |
| WO | 2008106449 A1 | 9/2008 |
| WO | 2009123754 A2 | 10/2009 |
| WO | 2010111499 A1 | 9/2010 |
| WO | 2012006265 A1 | 1/2012 |
| WO | 2013123592 A1 | 8/2013 |
| WO | 2013176888 A1 | 11/2013 |
| WO | 2013188825 A1 | 12/2013 |
| WO | 2014055513 A1 | 4/2014 |
| WO | 2014077166 A1 | 5/2014 |
| WO | 2014096475 A1 | 6/2014 |
| WO | 2014196638 A1 | 12/2014 |
| WO | 2015179761 | 11/2015 |
| WO | 2016205260 A1 | 12/2016 |
| WO | 2019099554 A1 | 5/2019 |

OTHER PUBLICATIONS

Doeffinger, Derek, editor. Using Filters. Eastman Kodak Company, 1988. The Kodak Workshop Series, pp. 11, 13, 17, 46, 68-69.

Fonseca, "Apple patents a virtual reality headset for iPhone," http://vr-zone.com/articles/apple-patents-virtual-reality-headset-iphone/87267.html, Jun. 22, 2015, 4 pp.

Van Der Lely, et al., "Blue Blocker Glasses as a Countermeasure for Alerting Effects of Evening Light-Emitting Diode Screen Exposure in Male Teenagers," Journal of Adolescent Health, Aug. 2014, 7 pp.

Kim, Boris F. and Bohandy, Joseph. "Spectroscopy of Porphyrins." Johns Hopkins APL Technical Digest, vol. 2, No. 1, 1981, pp. 153-163, www.jhuapl.edu/techdigest/views/pdfs/V02_N3.../V2_N3_1981_Kim. Retrieved Apr. 12, 2019.

Giovannetti, Rita. "The Use of Spectrophotometry UV-Vis for the Study of Porphyrins." Macro to Nano Spectroscopy, Uddin, Jamal (Ed.), IntechOpen Limited, 2012, pp. 87-108, www.intechopen.com/books/macro-to-nano-spectroscopy/the-use-of-spectrophotometry-uv-vis-for-thestudy-of-porphyrins. Retrieved Apr. 12, 2019.

Fritz, Norman L. "Filters: An Aid in Color-Infrared Photography." Photogrammetric Engineering and Remote Sensing, vol. 43, No. 1, Jan. 1977, pp. 61-72, www.asprs.org/wp-content/uploads/pers/1977journal/.../1977_jan_61-72. Retrieved Apr. 4, 2019.

Perovich, B. W. "Black and White Filters Tutorial." Freestyle Photographic Supplies. www.freestylephoto.biz/black-and-white-tilters-tutorial. Retrieved Apr. 12, 2019.

Richards, Bryce S. "Up- and Down-Conversion Materials for Photovoltaic Devices" Proceedings of SPIE—The International Society for Optical Engineering, 9 pp. Apr. 2012.

Simmons, Adam "The Evolution of LED Backlights." PC Monitors www.pcmonitorsinfo/articles. Retrieved May 1, 2017.

Gallas, Jim and Eisner, Mel; Chapter 23—Eye protection from sunlight damage; Journal; 2001; 437, 439-455; vol. 3. Comprehensive Series in Photosciences, Elvesier, abstract only.

"Capturing All the Light: Panchromatic Visible Absorption for Solar Photoconversion." U.S. Department of Energy, Basic Energy Sciences, Jun. 1, 2014, science.energy.gov/bes/highlights/2014/bes-2014-06-g/. Retrieved Apr. 12, 2019.

"Filters for Color Photomicrography," Olympus America Inc., Olympus Microscopy Resource Center, http://www.olympusmicro.com/primer/photomicrography/colorfilters.html, Mar. 2012, 7 pp.

"Kentek Laser Safe Window Protection", Retrieved at <<http://www.kenteklaserstore.com/category.aspx?categoryID=311>>, 1 pp. Retrieved on Apr. 28, 2014.

"Laser and fluorescent dyes, UV and NIR dyes, security inks and other optically functional materials", Retrieved at http://www.fabricolorholding.com/product, 2 pp. Retrieved May 28, 2015.

"Reticare, the first ocular protector for electronic device screens to launch at CES 2014"; https://www.reticare.com/tienda/en/blog/post/

(56) References Cited

OTHER PUBLICATIONS 3-reticare-the-first-ocular-protector-for-electronic-device-screens-to-launch-at-ces-2014; Jan. 10, 2014; 7 pp. Retrieved Nov. 30, 2017.
"Spectral-Transmittance Bar Charts for Selected Kodak Wratten Filters." google search (www.google.com), search terms: kodak wratten filters bar chart, second image (wratten filter specs, iclane.net). Retrieved May 16, 2019.
"XGear Krystal Sapphire Screen Protector Film Shield for Apple IPhone 4 4S", Retrieved at <<http://www.ebay.com/tm/XGear-Krystal-Sapphire-Screen-Protector-Film-Shield-For-Apple-IPhone-4-4S-/221364527502>>, 3 pp. Retrieved Apr. 28, 2014.
ebay.com, screenshot of ebay purchase of Apr. 23, 2019. Retrieved May 16, 2019.
Illuminant D65, 4 pp.
Kodak advertisement. Buchsbaum, Ralph. Animals Without Backbones. The University of Chicago Press, 1948.
"290 nm UV Dye", Technical Data Sheet, Product Code: UV290A, QCR Solutions Corp, Version: 2011.UV Dyes, www.qcrsolutions.com, 1 page.
"530 nm Visible Dye", Technical Data Sheet, Product Code: VIS530A, QCR Solutions Corp, Version: 2011.VIS Dyes, www.qcrsolutions.com, 1 page.
"675 nm Visible Dye", Technical Data Sheet, Product Code: VIS675F, QCR Solutions Corp, Version: 2011.VIS Dyes, www.qcrsolutions.com, 1 page.
"ABS 668: Visible Narrow Band Absorber", Exciton, Inc., www.exciton.com, 1 page.
"ABS 691: Visible Narrow Band Absorber", Exciton, Inc., www.exciton.com, 1 page.
"DYE VIS 347", Adam Gates & Company, LLC, www.adamgatescompany.com, 1 page.
"DYE VIS 670", Adam Gates & Company, LLC, www.adamgatescompany.com, 1 page.
"DYE VIS 671", Adam Gates & Company, LLC, www.adamgatescompany.com, 1 page.
"ADS640PP Product Specification", American Dye Source, Inc., Retrieved at <<https://adsdyes.com/products/laser-dyes-2/ads640pp/>>, Retrieved on May 18, 2015, 1 page.
"Infrared Dye 1422", Adam Gates & Company, LLC, www.adamgatescompany.com, 1 page.
"1003 nm NIR Dye", Technical Data Sheet, Product Code: NIR1003A, QCR Solutions Corp, Version 2011.NIR Dyes, www.qcrsolutions.com, 1 page.
"1031 nm NIR Dye", Technical Data Sheet, Product Code: NIR1031M, QCR Solutions Corp, Version: 2011.NIR Dyes, www.qcrsolutions.com, 1 page.
"1072 nm NIR Dye", Technical Data Sheet, Product Code: NIR1072A, QCR Solutions Corp, Version: 2011.NIR Dyes, www.qcrsolutions.com, 1 page.
"1073nm NIR Dye", Technical Data Sheet, Product Code: IR Dye 1151, Adam Gates & Company, LLC, www.adamgatescompany.com, 1 page.
"LUM690 Near Infrared Dye", Moleculum, moleculum.com, Jan. 2015, 2 pages.
"LUM995 Near Infrared Dye", Moleculum, moleculum.com, Jan. 2015, 2 pages.
"Near Infrared Dye: LUM1000A", Moleculum, moleculum.com, Jan. 2015, 1 page.
"Tinuvin P Benzotriazole UV Absorber", Ciba Specialty Chemicals, Inc.,Printing Date: Aug. 1998, 2 pages.
A-594-5 Invisible Blue Pigment, dayglo.com, 1 page. Retrieved Jun. 2, 2019.
Sunstone Luminescent UCP Nanocrystals, sigmaaldrich.com, 7 pp. Retrieved Apr. 17, 2017.
"New ANSI/ISEA Z87. 1-2010 Standard", Uvex by Sperian, 2 pages.
ANSI Z80.3-2015, Nonprescription Sunglass and Fashion Eyewear Requirements, 41 pp.
ASTM International E 313-05; Standard Practice for Calculating Yellowness and Whiteness Indices from Instrumentally Measured Color Coordinates; Article; 6 pp.
U.S. Appl. No. 16/695,983, filed Nov. 26, 2019; 54 pp.
U.S. Appl. No. 16/695,975, filed Nov. 26, 2019; 52 pp.
Non-Final Office Action for U.S. Appl. No. 14/719,604; dated Aug. 24, 2016; filed May 22, 2015; 41 pp.
Final Office Action for U.S. Appl. No. 14/719,604; dated Mar. 28, 2017; filed May 22, 2015; 66 pp.
Non-Final Office Action for U.S. Appl. No. 14/719,604; dated Aug. 30, 2017; filed May 22, 2015; 59 pp.
International Search Report and Written Opinion for International Application No. PCT/US2015/032175, dated Aug. 28, 2015; date of filing: May 22, 2015; 10 pp.
Non-Final Office Action for U.S. Appl. No. 16/695,983; dated Jun. 30, 2020; filed Nov. 26, 2019; 24 pp.
Non-Final Office Action for U.S. Appl. No. 16/855,497; dated Jul. 1, 2020; filed Apr. 22, 2020; 13 pp.
Search Report and Examination Opinion for European Application No. 15796219.2; dated Aug. 12, 2017; date of filing: May 22, 2015; 7 pp.
Search Report and Examination Opinion for European Application No. 15796219.2; dated Mar. 26, 2019; date of filing: May 22, 2015; 5 pp.
First Office Action for C.N. Application No. 201580040377.2 (national phase of PCT/US2015/032175); dated Feb. 24, 2018; date of filing: May 22, 2015; 5 pp.
Second Office Action for C.N. Application No. 201580040377.2 (national phase of PCT/US2015/032175); dated Jan. 2, 2019; date of filing: May 22, 2015; 12 pp.
First Office Action for J.P. Application No. 2017-032775 (national phase of PCT/US2015/032175); dated May 15, 2019; date of filing: May 22, 2015; 6 pp.
Second Office Action for J.P. Application No. 2017-032775 (national phase of PCT/US2015/032175); dated Feb. 4, 2020; date of filing: May 22, 2015; 22 pp.
International Search Report and Written Opinion for International Application No. PCT/US2016/037457, dated Sep. 16, 2016; date of filing: Jun. 14, 2016; 7 pp.
First Office Action for C.N. Application No. 201680048240.6 (national phase of PCT/US2016/037457); dated Jan. 16, 2020; date of filing: Jun. 14, 2016; 10 pp.
Non-Final Office Action for U.S. Appl. No. 15/844,109; dated Sep. 4, 2019; filed Dec. 15, 2017; 49 pp.
Final Office Action for U.S. Appl. No. 15/844,109; dated Jan. 16, 2020; filed Dec. 15, 2017; 12 pp.
International Search Report and Written Opinion for International Application No. PCT/US2018/061103, dated Jan. 24, 2019; date of filing: Nov. 14, 2018; 6 pp.
Non-Final Office Action for U.S. Appl. No. 16/360,599; dated Jun. 28, 2019; filed Mar. 21, 2019; 11 pp.
Final Office Action for U.S. Appl. No. 16/855,497; dated Sep. 22, 2020; filed Apr. 22, 2020; 12 pp.

* cited by examiner

WHITE LED LIGHT SOURCE AND METHOD OF MAKING SAME

RELATED APPLICATIONS

This application claims the benefit of U.S. Provisional Patent Application Ser. No. 62/884,975, filed Aug. 9, 2019 and titled, "WHITE LED LIGHT SOURCE AND METHOD OF MAKING SAME", which is herein incorporated by reference in its entirety.

FIELD

The present invention relates to illumination devices and, in particular, to light-emitting diodes (LEDs) for electronic display devices.

BACKGROUND

Light-emitting diodes (LEDs) are well-known solid-state lighting devices. LEDs generally include a semiconductor chip having a plurality of semiconductor layers grown on a substrate such as a sapphire, silicon or gallium nitride substrate. The semiconductor layers include n-type and p-type semiconductor layers, in contact with each other, such that when a sufficient voltage is applied, electrons in the n-type layers and holes in the p-type layers flow toward each other. Electrons and holes then recombine, and each time this occurs, a photon of light is emitted. The wavelength distribution of light emitted by an LED generally depends on the particular semiconductor materials used and the structure of the thin epitaxial layers that make up an active region of the device where the electrons and holes recombine.

Most LEDs are monochromatic light sources that appear to emit light having a single wavelength (color). LEDs can be designed to provide different colors of light, in accordance with color theory, by using a combination of LEDs, each LED emitting light of a different color. For example, a white LED light source can be made by using a combination of individual LEDs, each LED emitting red, green or blue light. The different colors of light emitted by the individual LED chips combine to produce a desired intensity and/or color of white light, depending on the relative intensities of the individual LEDs.

SUMMARY

This disclosure relates to an LED light source comprising an LED and an encapsulant that includes a light-absorbing component that absorbs light from about 415 nm to about 455 nm, wherein the LED light source emits white light. In some embodiments, the light-absorbing component can be a dye, with characteristics meant to achieve requirements for reduced blue light and color performance from displays. The dye can have an absorbance maximum of from about 425 nm to about 435 nm or from about 430 nm to about 435 nm. The light-absorbing component can be an organic or an inorganic pigment. In some embodiments, the-light-absorbing component can be present in an amount such that the LED light source has a "percent reduction in blue light hazard" of about 15 or greater. In some embodiments, the LED can be an organic light-emitting diode (OLED). In some embodiments, the encapsulant can also include a single phosphor, or it can include first and second phosphors, wherein the first phosphor converts blue light into green light, and the second phosphor converts blue light into yellow light. In some embodiments, the encapsulant can include a silicon-containing polymer.

This disclosure further relates to a light source that can include an LED, a first encapsulant that can have a light-absorbing component absorbing light in a wavelength range of from about 415 nm to about 455 nm, and a second encapsulant that can include a phosphor. The disclosed light source can emit white light. In some embodiments, the first encapsulant can be in contact with the LED, and the second encapsulant may not be in contact with the LED. In some embodiments, the second encapsulant can be in contact with the LED, and the first encapsulant may not be in contact with the LED. The first encapsulant may further include at least one dye or pigment having a peak wavelength in the green or red regions of the visible spectrum.

In any of the above example, the LED light source can further include a topmost layer or dome lens that can include at least one dye or pigment having a peak wavelength in the green or red regions of the visible spectrum.

Features and advantages of the present disclosure will be more readily understood from the following detailed description which should be read in conjunction with the accompanying drawings.

BRIEF DESCRIPTION OF THE DRAWINGS

The drawings are schematic illustrations and are not intended to limit the scope of the invention in any way. The drawings are not necessarily to scale.

Figure 1:
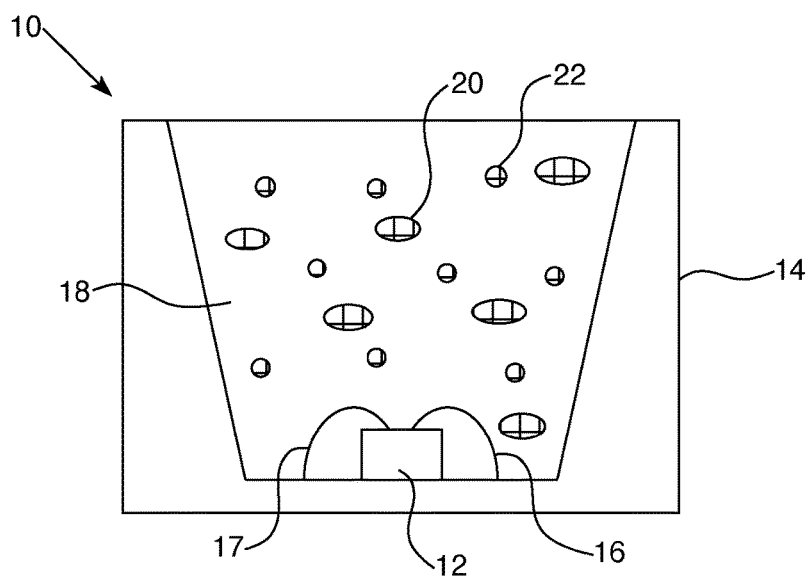
FIG. 1 is a schematic diagram of an exemplary LED according to the present disclosure in which two different phosphors are dispersed in the encapsulant.

In the present disclosure:

"color gamut" refers to the entire range of colors available for a particular device;

"correlated color temperature" (CCT) refers to the color appearance of light emitted by a light source relating its color to the color of light from a reference source when heated to a particular temperature in degrees K;

"luminance" refers to the intensity of light emitted from a surface per unit area in a given direction;

"phosphor" refers to a compound or a material or, in some instances, a combination of compounds or materials, that absorb light at one wavelength and emit light at a higher wavelength;

"primary light" refers to the light intensity and the color of light directly emanating from a light source before it is altered by an added absorber, fluorescer, or phosphorescer; and "secondary light" refers to the light intensity and the color of light directly emanating from a light source after it is altered by an added absorber, fluorescer, or phosphorescer.

The disclosed light source that includes an LED light source and one or more encapsulants containing a light-absorbing component, and that absorbs light in the wavelength range of about 415 nm to about 435 nm, can provide an LED light source that emits white light having a reduced amount of blue light or even toxic blue light with minimal effect on color characteristics such as correlated color temperature (CCT), color gamut, and luminance. It can meet emerging standards for eye safety that are being developed by TUV Rheinland and the American National Standards Institute (ANSI).

DETAILED DESCRIPTION

In the following detailed description, embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims. It is to be understood that various omissions and substitutions of equivalents are contemplated as circumstances may suggest or render expedient, but these are intended to cover applications or embodiments without departing from the spirit or scope of the claims attached hereto. Also, it is to be understood that the phraseology and terminology used herein are for the purpose of description and should not be regarded as limiting.

The present disclosure relates to a semiconductor light emitting device and associated materials and methods. More particularly, the present disclosure relates to formulations and methods that can be used for color correction of light emitted by such devices. In general, the semiconductor light-emitting device can provide reduced toxic blue light emission. In some embodiments, the semiconductor light emitting device can provide reduced toxic blue light emission with little or no change in color characteristics as compared to a device without reduced toxic blue light emission. Particulars of the present disclosure are provided herein.

Thus, it is an object of the present disclosure to provide a light source that emits white light having a reduced amount of blue light, or toxic blue light, with minimal effect on color characteristics such as correlated color temperature (CCT), color gamut and luminance. The LED light source can include several LEDs or organic light-emitting diodes (OLEDs) and can further include a blue light-absorbing material, along with one or more phosphors, such that the LED light source emits white light. The blue light-absorbing material can absorb at least some of the "primary light", which reduces or eliminates the need for color correction by incorporation of green and/or red absorbing materials, which often results in reduced luminance. Another object of the present invention is to provide a method of making the LED light source disclosed herein.

Referring to FIG. 1, exemplary LED light source 10 includes LED 12 mounted on a substrate that forms part of cup 14. In some embodiments, cup 14 is a reflecting cup, and in other embodiments, LED 12 is mounted on a circuit board or some plastic electronic substrate. LED 12 has at least two separate electrical contacts with wire bonds 16 and 17 forming electrical connection between LED 12 and a power source. LED 12 includes a diode that emits radiation such as visible or ultraviolet light or some combination thereof, as described below. Encapsulant 18 includes red and green phosphor materials, 20 and 22, respectively, for converting radiation or light emitted by LED 12 into radiation or light having a wavelength different from that being emitted, as further described below. In some embodiments, such as that shown in FIG. 1, phosphors 20 and 22 can be randomly distributed within encapsulant 18. In other embodiments, phosphor 20 can be in one layer of encapsulant that is directly in contact with LED 32 and phosphor 22 can reside in a separate layer of encapsulant that is disposed upon the first layer.

Figure 2:
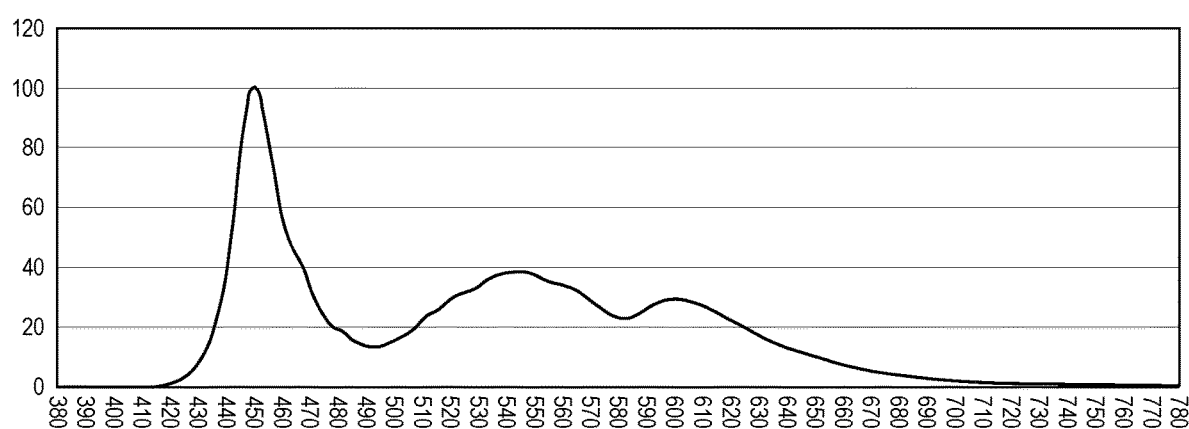
FIG. 2 is an emission spectrum of an LED configured to emit white light. The horizontal axis is in nanometers, the vertical axis in arbitrary units.

FIG. 2 is an exemplary emission spectrum of an LED light source configured to emit white light, such as LED light source 10 shown in FIG. 1. The spectrum shows intensity (arbitrary units) as a function of nanometers. Particular wavelengths of blue light are labeled in FIG. 2 (415 nm to 500 nm). As used herein, "blue light" refers to light in the visible spectrum of from about 380 to about 500 nm. Within the blue light region there is thought to exist "good blue light" having wavelengths from about 450 to about 500 nm and "toxic blue light" having wavelengths from about 415 to about 455 nm. The effects of good and toxic blue light have been described in U. S. Pat. Publ. Nos. 2018/0107050 A1; 2019/0196071 A1; and 2019/0219751 (all Barrett et al.).

The spectrum in FIG. 2 shows intensity (arbitrary units) as a function of nanometers, wherein an arbitrary unit is a relative unit of measurement indicating the ratio of intensities of an experimental sample having a structure shown in FIG. 1 to that of a reference sample. Arbitrary units are sometimes referred to as normalized intensity in which the maximum of a given spectrum is normalized to a count value of 1. In general, most spectrophotometers work by spatially separating light into its component wavelengths by means of a diffraction grating, and a charge-coupled device (CCD) array measures intensity, or power per unit area in watts per square meter, depending on the optical resolution provided by the grating. Each time a photon strikes and is absorbed by an atom on a pixel of the CCD array, an electron is kicked off the atom and a count is recorded as a net charge on the pixel. The resulting CCD image is processed and analyzed such that the number of counts is summed to give a total number of counts, or intensity, as a function of wavelength. Thus, intensity refers to the number of photons that generate charge on individual pixels of a CCD array. Intensities are normalized by assigning the value of 1 to a pixel that is saturated.

Figure 3:
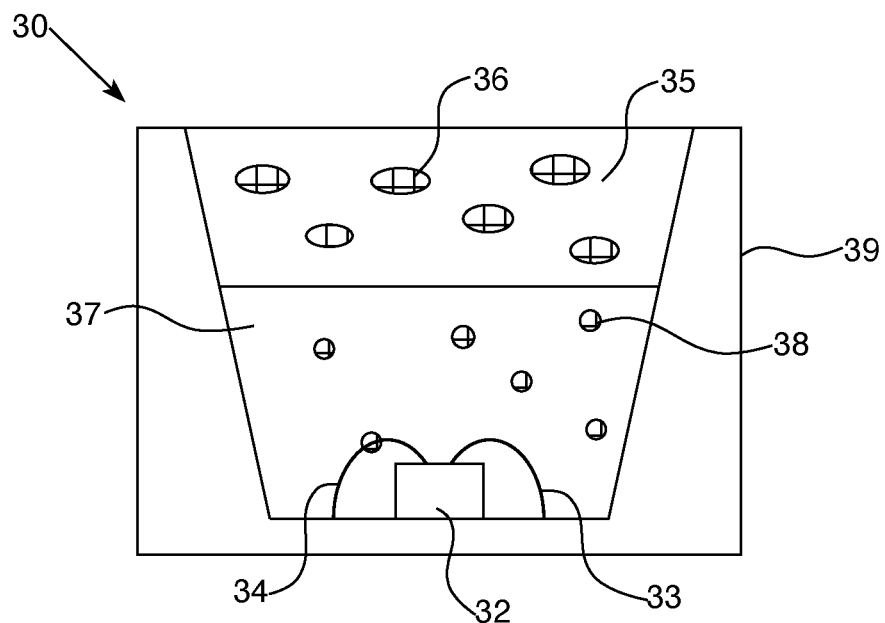
FIG. 3 is a schematic diagram of an exemplary LED according to the present disclosure in which one phosphor is dispersed in one layer of encapsulant and another different phosphor is dispersed in another layer of encapsulant.

FIG. 3 is an exemplary illustration of an embodiment of the disclosed LED light source in which LED light source 30 includes LED 32 mounted on a substrate that forms part of cup 39. In some embodiments, cup 39 is a reflecting cup, and in other embodiments LED 32 is shown mounted on a circuit board or plastic electronic substrate. LED 32 has at least two separate electrical contacts with wire bonds 33 and 34 forming an electrical connection between the LED and a power source. LED 32 includes a diode that emits radiation such as visible or ultraviolet light or some combination thereof, as described below. First encapsulant 37 includes first phosphor 38 dispersed within. As illustrated, first encapsulant 37 is shown in direct contact with LED 32. Second encapsulant 35 has a second phosphor 36 dispersed within and is disposed in a separate layer in contact with encapsulant layer 37 but not in contact with LED 32.

The LED light source disclosed herein includes an LED (or, alternatively, an OLED) and an encapsulant, wherein the encapsulant includes components capable of converting the wavelength of at least some of the radiation or light emitted by the LED to radiation or light having a different wavelength. In some embodiments, the LED light source includes at least one phosphor capable of converting higher energy blue light into lower energy light, for example, green, yellow, or red light or even lower energy blue light. In some embodiments, such as the embodiment illustrated in FIG. 3, the LED light source includes two phosphors, each phosphor capable of converting light emitted by the LED into two different lower energy wavelengths respectively. In some embodiments, one phosphor converts blue light emitted by the LED into green light and another phosphor converts blue light emitted by the LED into red light. In some embodiments, the LED light source includes an LED and an encapsulant comprising a light-absorbing component that absorbs light from about 415 nm to about 455 nm, wherein the LED light source emits white light. In some embodiments, the LED light source includes at least one phosphor and at least one light-absorbing component.

Figure 4:
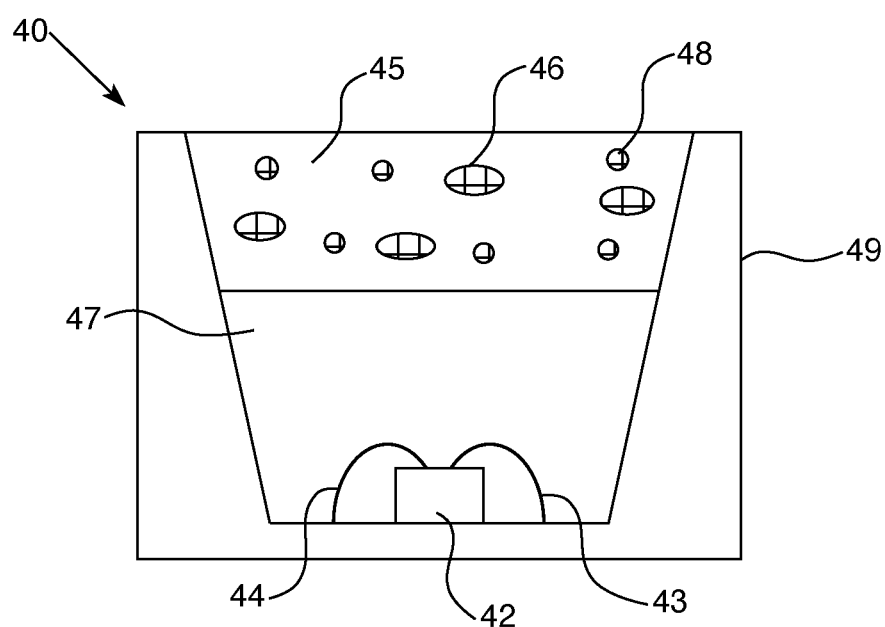
FIG. 4 is a schematic diagram of an exemplary LED according to the present disclosure in which two different phosphors are dispersed in one layer of encapsulant and another layer of encapsulant (disposed directly upon the LED) has no phosphors.

FIG. 4 illustrates another embodiment of the disclosed LED light source. LED light source 40 includes LED 42 mounted on a substrate that forms part of cup 49. In some embodiments, cup 49 is a reflecting cup, and in other embodiments, LED 42 is mounted on a circuit board or some plastic electronic substrate. LED 42 has at least two separate electrical contacts with wire bonds 43 and 44. LED 42 includes a diode that emits radiation such as visible or ultraviolet light or some combination thereof, as described below. First encapsulant 47 includes a light-absorbing material, and second encapsulant 45 includes red and green phosphor materials, 46 and 48, respectively, for converting radiation or light emitted by LED 42 into radiation or light having a wavelength different from that being emitted, as further described below.

For the embodiment shown in FIG. 4, the light-absorbing component is evenly distributed in first encapsulant 47 that is directly in contact with LED 42. If a curable pre-encapsulant as described above is used for first encapsulant 47, it can be cured prior to formation of second encapsulant 45. Second encapsulant 45 includes red and green phosphor materials, 46 and 48, respectively, which can be, but are not necessarily, evenly distributed within the second encapsulant. Second encapsulant 45 can include a pre-encapsulant which can be cured as described above. A similar process can be used to create the embodiment of the LED light source shown in FIG. 3.

Configurations of the disclosed LED light source other than those illustrated in FIGS. 3 and 4 are also contemplated. For example, in the embodiment illustrated in FIG. 3, the two phosphors, 36 and 38 can be in the opposite layers as shown in the figure. An LED light source configuration similar to that illustrated in FIG. 4 is also contemplated in which the layer containing both phosphors, 46 and 48 is directly adjacent to LED 42 and encapsulant 47 disposed upon the phosphor-containing encapsulant layer. Any combinations or permutations of the illustrated arrangements is also contemplated.

The LED light source disclosed herein includes an LED (or, alternatively, an OLED) and an encapsulant, wherein the encapsulant includes components capable of converting the wavelength of at least some of the radiation or light emitted by the LED to radiation or light having a different wavelength. In some embodiments, the LED light source includes at least one phosphor capable of converting higher energy blue light into lower energy light, for example, green, yellow, or red light or even lower energy blue light. In some embodiments, such as the embodiment illustrated in FIG. 3, the LED light source includes two phosphors, each phosphor capable of converting light emitted by the LED into two different lower energy wavelengths respectively. In some embodiments, one phosphor converts blue light emitted by the LED into green light and another phosphor converts blue light emitted by the LED into red light. In some embodiments, the LED light source includes an LED and an encapsulant comprising a light-absorbing component that absorbs light from about 415 nm to about 455 nm, wherein the LED light source emits white light. In some embodiments, the LED light source includes at least one phosphor and at least one light-absorbing component.

The light-absorbing component can be of any type provided the LED light source can function as desired including being able to emit white light. The light-absorbing component may be a dye having an absorbance maximum of from about 425 nm to about 435 nm, or from about 430 nm to about 435 nm. Typically, the absorbance peak of the light-absorbing component can have a full width at half-maximum of less than about 100 nm, less than about 50 nm, less than about 25 nm, or even less. The light-absorbing component may be a pigment such as an organic pigment. Useful organic pigments include those having a particle size of from about 10 nm to about 200 nm or from about 10 nm to about 100 nm. The light-absorbing component may be a pigment such as an inorganic pigment. The light-absorbing component may include a combination of dye, organic pigment and/or inorganic pigment. One of the purposes of adding a light-absorbing component, such as a pigment or dye, to the encapsulant in addition to the one or more phosphors can be to absorb or reduce toxic blue light emitted by the LED. In some embodiments, the dye or pigment may fluoresce or absorb toxic blue light and reemit it by fluorescence at a high wavelength. By adjusting the type of phosphor or phosphors and the type of dye or pigment used in the LED light source, toxic blue light can be reduced and the overall color of the LED light source can be adjusted to balance color (mostly reduce yellowness), color intensity (luminance) and color temperature (CCT).

The amount of light-absorbing component used in the encapsulant may include any amount needed to produce the desired effect. In some embodiments, the light-absorbing component may be present in an amount necessary to provide a "percent reduction in blue light hazard" of at least about 15, at least about 20, or even at least about 30, at least about 50, at least about 75, or even higher. In some embodiments, the "percent reduction in blue light hazard" is between about 15 and 75.

"Percent reduction in blue light hazard" designates the level of high energy blue light being filtered from a digital display and its calculation is shown below. One example of an emission standard, and related technology, for "percent reduction in blue light hazard" is the RPF® (RETINA PROTECTION FACTOR) standard, which has been introduced by Eyesafe, Inc. LLC, Eden Prairie, Minn. for use in connection with electronic displays, display covers, optical filters, LED's and related products and materials. The standard and associated "percent reduction in blue light hazard" value can, in one embodiment, ensure that overall display color quality is maintained so that the visual experience is not impacted. The testing and evaluation protocol measure the level of protection based on the Spectral Weighting Factors for Blue-Light Hazard, as published by the International Commission on Non-ionizing Radiation Protection (ICNIRP) in 2013 and adopted by the American National Standards Institute (ANSI) in 2015. The "percent reduction in blue light hazard" is identified by a percentage number between 0 and 100, calculated as $100 \times (LB_{without} - LB_{with})/LB_{without}$ in which $LB_{without}$ is the blue light hazard weighted irradiance calculated without correction and $LB_{with}$ is the blue light hazard weighted irradiance calculated with correction:

$$LB = \Sigma L(\lambda) \times B(\lambda) \times \Delta \lambda w$$

where:
$L(\lambda) = E\lambda (\lambda, t)$ is the spectral irradiance in W/m²/nm⁻¹,
$B(\lambda)$ = Blue Light Hazard Function from ICNIRP, and
$\Delta \lambda = 1$.

The encapsulant can include a phosphor for converting radiation or light emitted by the LED. In some embodiments, the phosphor converts radiation or light emitted by the LED into radiation or light having a wavelength different from that being emitted. For example, a phosphor that absorbs blue light can be used such that the phosphor converts or re-emits the absorbed light in the green and/or red regions of the visible spectrum. In this way, the combination of LED and phosphor can be selected such that the LED light source emits white light. In some embodiments, the encapsulant includes at least two phosphors, wherein both phosphors absorb blue light and one phosphor converts this light into red light, and the other into green light. The phosphor may be evenly or unevenly distributed within the encapsulant of the LED light source depending on the desired effect.

In some embodiments, the encapsulant of the LED light source includes the light-absorbing component (dye or pigment) and two phosphors wherein both phosphors absorb blue light and one phosphor converts this light into red light, and the other into green light. In this embodiment, the light-absorbing component and the two phosphors can be evenly distributed throughout the encapsulant. In another embodiment, the light-absorbing component may be unevenly distributed and the two phosphors evenly or unevenly distributed, such that the amount of the light-absorbing component increases as the distance from the LED increases. Other uneven distributions are also contemplated. In yet another embodiment, the light-absorbing component may be unevenly distributed and the two phosphors evenly or unevenly distributed, such that the amount of the light-absorbing component decreases as the distance from the LED decreases.

The encapsulant can include any suitable material known in the art for making LED light sources. The encapsulant can be made from an uncured pre-encapsulant material such that after it is contacted with the LED, the material cures by exposure to its environment or by application of curing means such as heat and/or radiation. In some embodiments, radiation is actinic radiation. Suitable materials which can be used as the encapsulant include polymeric materials such as silicon-containing polymers as described in U.S. Pat. No. 7,192,795 (Boardmen et al.) and U. S. Pat. Publ. No. 2004/0116640 A1 (Miyoshi), as well as certain epoxy, and acrylate resins.

The encapsulant can include additional materials, such as dyes and/or pigments, in order to correct the color temperature of the LED light source. In some embodiments, dyes and/or pigments are included in the encapsulant such that the difference in CCT is no greater than a given amount. For example, dyes and/or pigments can be included in the encapsulant such that the difference in CCT is no greater than about 300K. In some embodiments, the dyes and/or pigments can be included in the encapsulant such that any decrease in luminance of the LED light source is minimized. For example, the dyes and/or pigments can be included in the encapsulant such that the luminance of the LED decreases by no greater than about 20%, about 10% or about 5%. In some embodiments, the dyes and/or pigments can be included in the encapsulant such that the difference in CCT is no greater than about 300K and the luminance of the LED decreases by no greater than about 20%.

CIE (International Commission on Illumination) chromaticity coordinates "x" and "y" that map the change in color should show minimal change from the standard (control) white LED. Typically, the x-component of chromaticity should change less than about 0.0012, less than about 0.0008, less than about 0.0006 or even less than about 0.0004 in the disclosed LED light sources. Additionally, the y-component of chromaticity should change less than about 0.015, less than about 0.011, or even less than 0.009 in color space.

In some embodiments, the LED light source may include a topmost layer in the form of a film layer or dome lens as described, for example, in U.S. Pat. No. 9,755,120 B2 (Thompson et al.). The light-absorbing material, one or more phosphors, and any additional dyes and/or pigments can be included in the film or dome lens in order for the LED light source to function as desired.

EXAMPLES

The following ingredients were used to prepare encapsulated LED light sources:
Materials
LED chip—blue emitting
253HE—a proprietary dye with a maximum absorbance of 433 nm.
Phosphor A—PA570—a proprietary phosphor absorbing in the blue/UV spectral range and having a maximum emission at 570 nm (yellow).
Phosphor B—PA556D1—a proprietary phosphor absorbing in the blue/UV spectral range and having a maximum emission at 556 nm (green).
Junction Coating Resin—two-part encapsulating resin that cures at 150° C. for four hours after the catalyst is added.
Procedure
A 0.5% solution of the absorbing dye 253HE was prepared in toluene. An LED encapsulant package was made by mixing a combination of phosphor A, phosphor B, and 253HE dye solution and injecting it into an encapsulant mixture of the junction coating resin. The modified encapsulant package (with absorbers and phosphors) was placed over a blue-emitting LED and was allowed to cure.

The LED was activated, and the emission spectrum was scanned from 380 nm to 780 nm in 1 nm scan. The "percent reduction in blue light hazard" (in %), change in Luminance (in %) and change in CCT (Correlated Color Temperature) were recorded for various samples. Each LED tested was placed into a test socket connected to a driver, was activated, and then the socket with LED was inserted into a luminous intensity adapter. The emission spectrum was recorded by spectroradiometer. "Percent reduction in blue light hazard", change in Luminance, change in CCT, and the chromaticity coordinates x and y were calculated by comparing emission spectra of a standard white LED and of the experimental LED.

Table I below shows the compositions and Table II shows results of the testing of various compositions of encapsulants cured onto a blue LED.

TABLE I

Encapsulant Compositions (% by wt.)

| Composition | Control | Comparative Example 1 | Example 2 | Example 3 |
|---|---|---|---|---|
| Encapsulant | 69.15 | 67.50 | 64.11 | 63.34 |
| 253HE solution | 0 | 2.38 | 1.56 | 4.16 |
| Phosphor A | 20.69 | 20.19 | 23.02 | 21.79 |
| Phosphor B | 10.17 | 9.93 | 11.31 | 10.71 |

TABLE II

Test Results of Examples

| Sample | Percent reduction in blue light hazard (%) | Change in Luminance (%) | Change in CCT, K | Δx | Δy |
|---|---|---|---|---|---|
| Control | 0 | 0 | 0 | 0 | 0 |
| Comparative Example 1 | 39.3 | −54.9 | 8274 | −0.0157 | −0.0406 |
| Example 2 | 15.7 | +7.4 | −2368 | 0.0196 | 0.0338 |
| Example 3 | 17.1 | −16.5 | −131 | 0.0014 | −0.0016 |

Figure 5:
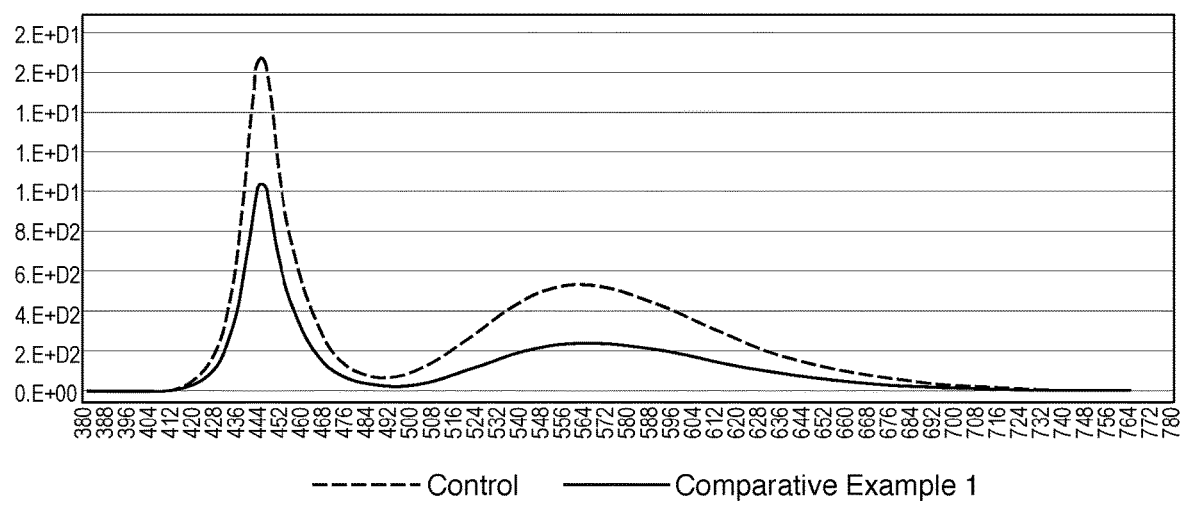
FIG. 5 is an emission spectrum of the LED described in the Control. The horizontal axis is in nanometers, the vertical axis in arbitrary units.

FIG. 5 is an emission spectrum of the LED described in Comparative Example 1 overlaid on the emission spectrum of the Control sample. The horizontal axis is in nanometers, the vertical axis in arbitrary units. Comparative Example 1 shows that both blue light (380 nm to 500 nm and light from the two phosphors (absorption between about 500 nm and 700 nm) are reduced compared to the Control that has no blue absorbing dye. Consequently, Comparative Example 1 does not both reduce the blue light emission and balance the color and luminance.

Figure 6:
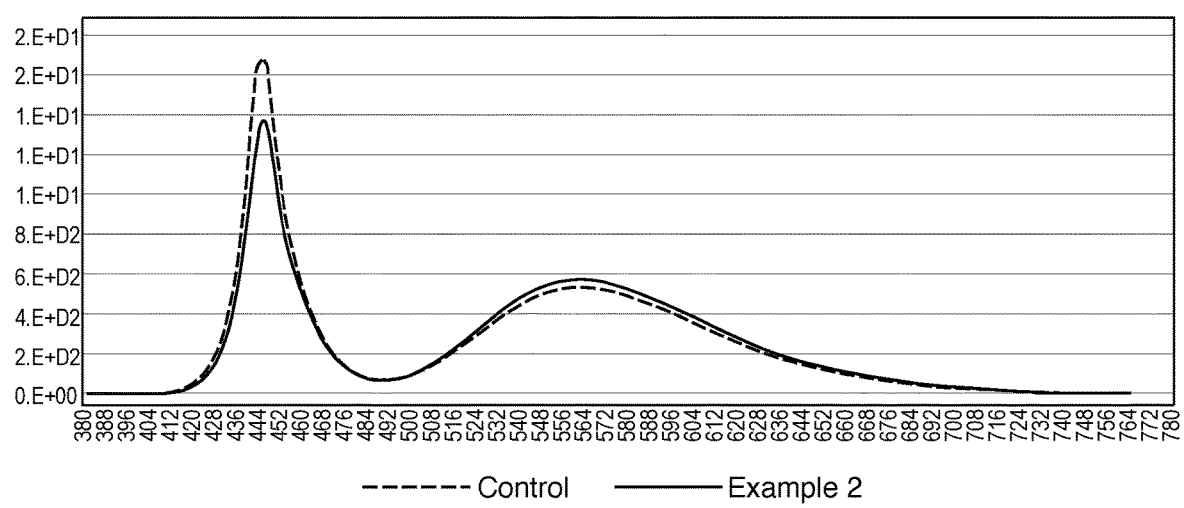
FIG. 6 is an emission spectrum of the LED described in Example 2. The horizontal axis is in nanometers, the vertical axis in arbitrary units.

FIG. 6 is an emission spectrum of the LED described in Example 2 overlaid on the emission spectrum of Example 2. The horizontal axis is in nanometers, the vertical axis in arbitrary units. Example 2 shows that blue light emission is reduced as well as emission in the 500-700 nm range.

Figure 7:
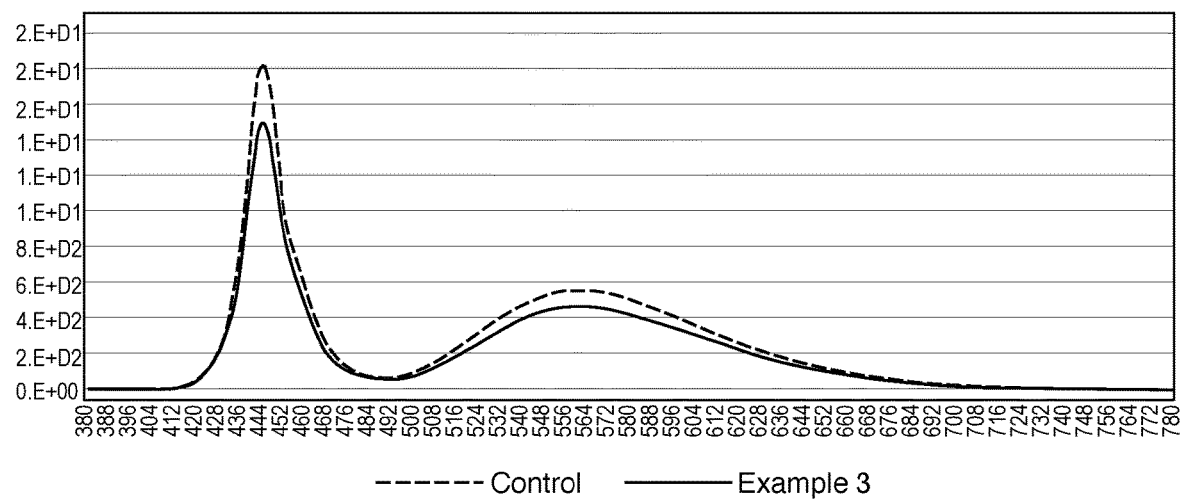
FIG. 7 is an emission spectrum of the LED described in Example 3. The horizontal axis is in nanometers, the vertical axis in arbitrary units.

FIG. 7 is an emission spectrum of the LED described in Example 3 overlaid on the emission spectrum of Example 3. The horizontal axis is in nanometers, the vertical axis in arbitrary units. Example 3 shows that blue light emission is reduced as well as emission in the 500-700 nm range.

These examples show that Examples 2 and 3 produce an LED light source that changes the Correlated Color Temperature (CCT) less than 3000K. In Example 3, the chromaticity changes are much reduced from the other Examples.

While embodiments of the invention have been illustrated and described, it will also be apparent that various modifications can be made without departing from the scope of the invention. It is also contemplated that various combinations or sub combinations of the specific features and aspects of the disclosed embodiments can be combined with or substituted for one another in order to form varying modes of the invention. Accordingly, it is not intended that the invention be limited, except as by the appended claims. All references cited within are herein incorporated by reference in their entirety.

What is claimed is:

1. An LED light source comprising:
    an LED,
    wherein the LED light source emits white light;
        a first encapsulant comprising a light-absorbing component that absorbs light from about 415 to about 455 nm, wherein the light-absorbing component comprises a dye, an organic pigment, or an inorganic pigment; and
        a second encapsulant comprising a phosphor.

2. The LED light source of claim 1, wherein the first encapsulant is in contact with the LED, and the second encapsulant is not in contact with the LED.

3. The LED light source of claim 2, wherein the first encapsulant further comprises at least one dye or pigment having an absorption peak wavelength in the green or red regions of the visible spectrum.

4. The LED light source of claim 1, wherein the second encapsulant is in contact with the LED, and the first encapsulant is not in contact with the LED.

5. The LED light source of claim 1, wherein the light-absorbing component comprises a dye having an absorbance maximum of from about 425 nm to about 435 nm.

6. The LED light source of claim 1, wherein the light-absorbing component comprises a dye have having an absorbance maximum of from about 430 nm to about 435 nm.

7. The LED light source of claim 1, further comprising a topmost layer or dome lens,
    wherein the topmost layer or dome lens further comprises at least one dye or pigment having an absorption peak wavelength in the green or red regions of the visible spectrum.

8. The LED light source of claim 1, wherein the second encapsulant comprises a first phosphor and a second phosphor.

9. The LED light source of claim 8, wherein each phosphor converts light into two different lower energy wavelengths, respectively.

10. The LED light source of claim 9, wherein the first phosphor converts blue light into green light and the second phosphor converts blue light into yellow light.

11. The LED light source of claim 1, wherein the first encapsulant, the second encapsulant, or both comprise a silicon-containing polymer.

12. The LED light source of claim 1 having a percent reduction in blue light hazard of about 15 or greater.

\* \* \* \* \*

UNITED STATES PATENT AND TRADEMARK OFFICE
CERTIFICATE OF CORRECTION

PATENT NO. : 10,971,660 B2
APPLICATION NO. : 16/696516
DATED : April 6, 2021
INVENTOR(S) : Harris et al.

Page 1 of 1

It is certified that error appears in the above-identified patent and that said Letters Patent is hereby corrected as shown below:

In the Specification

Column 2, Line 17 should read as follows:
-- In any of the above examples, the LED light source can --

Column 8, Line 36 should read as follows:
-- LED chip—blue emitting. --

Column 9, Line 34 should read as follows:
-- shows that both blue light (380 nm to 500 nm) and light from --

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*